(12) United States Patent
Yen et al.

(10) Patent No.: US 11,735,433 B2
(45) Date of Patent: Aug. 22, 2023

(54) SUBSTRATE STRUCTURE, PACKAGE STRUCTURE AND METHOD FOR MANUFACTURING ELECTRONIC PACKAGE STRUCTURE

(71) Applicant: Advanced Semiconductor Engineering, Inc., Kaohsiung (TW)

(72) Inventors: You-Lung Yen, Taoyuan (TW); Bernd Karl Appelt, Holly Springs, NC (US)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 58 days.

(21) Appl. No.: 17/213,033

(22) Filed: Mar. 25, 2021

(65) Prior Publication Data

US 2022/0310410 A1 Sep. 29, 2022

(51) Int. Cl.
| | |
|---|---|
| H01L 21/48 | (2006.01) |
| H01L 23/66 | (2006.01) |
| H01L 23/498 | (2006.01) |
| H01Q 1/22 | (2006.01) |
| H01L 23/552 | (2006.01) |
| H01L 23/14 | (2006.01) |
| H01L 23/00 | (2006.01) |

(52) U.S. Cl.
CPC ...... *H01L 21/4857* (2013.01); *H01L 21/4803* (2013.01); *H01L 23/49822* (2013.01); *H01L 23/49838* (2013.01); *H01L 23/552* (2013.01); *H01L 23/66* (2013.01); *H01Q 1/2283* (2013.01); *H01L 23/142* (2013.01); *H01L 24/16* (2013.01); *H01L 2223/6677* (2013.01); *H01L 2224/16227* (2013.01)

(58) Field of Classification Search
None
See application file for complete search history.

(56) References Cited

U.S. PATENT DOCUMENTS

2022/0149020 A1* 5/2022 Chang ............... H01L 23/49838

\* cited by examiner

*Primary Examiner* — Long Pham
(74) *Attorney, Agent, or Firm* — Foley & Lardner LLP

(57) ABSTRACT

A substrate structure, a package structure, and a method for manufacturing an electronic package structure provided. The substrate structure includes a dielectric layer, a trace layer, and at least one wettable flank. The dielectric layer has a first surface and a second surface opposite to the first surface. The trace layer is embedded in the dielectric layer and exposed from the first surface of the dielectric layer. The at least one wettable flank is stacked with a portion of the trace layer embedded in the dielectric layer.

18 Claims, 14 Drawing Sheets

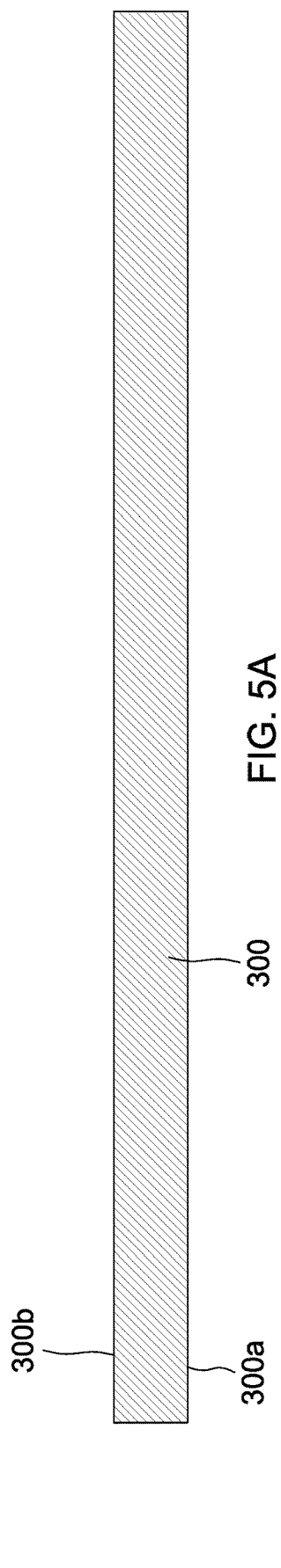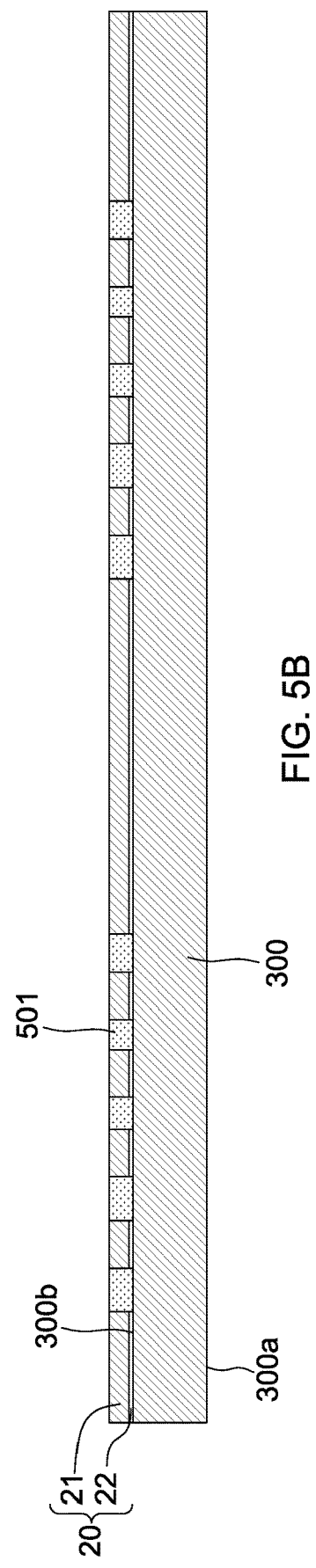

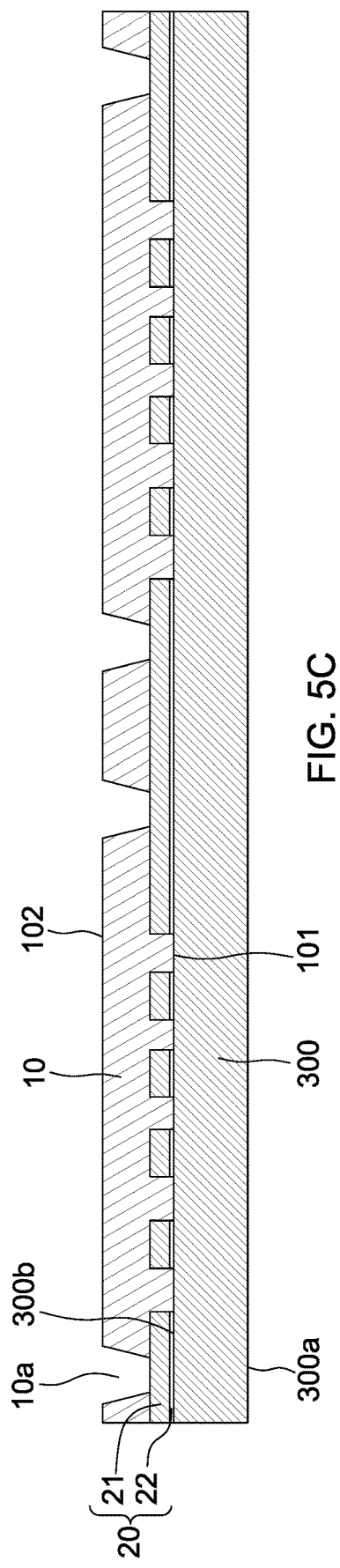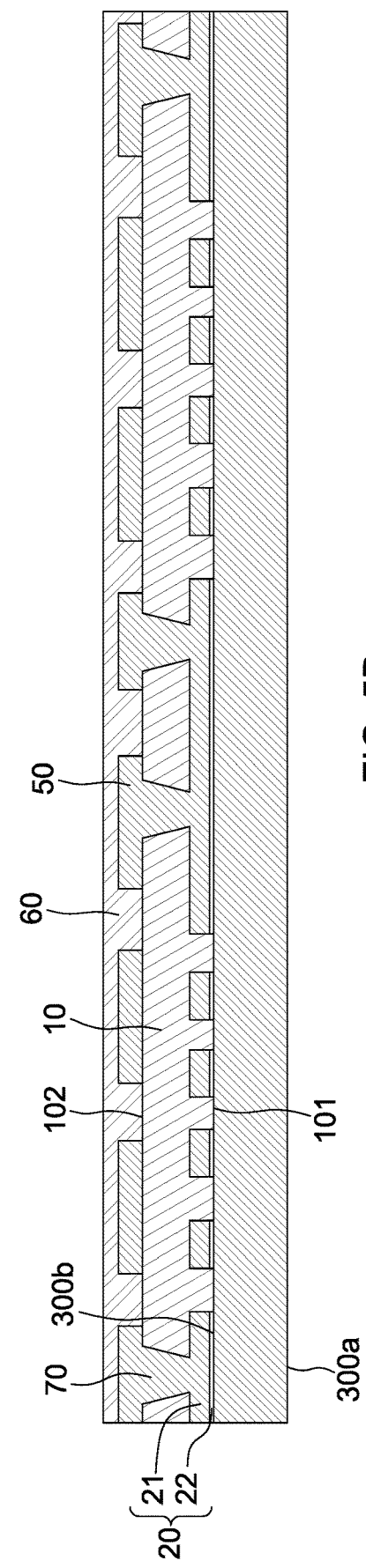

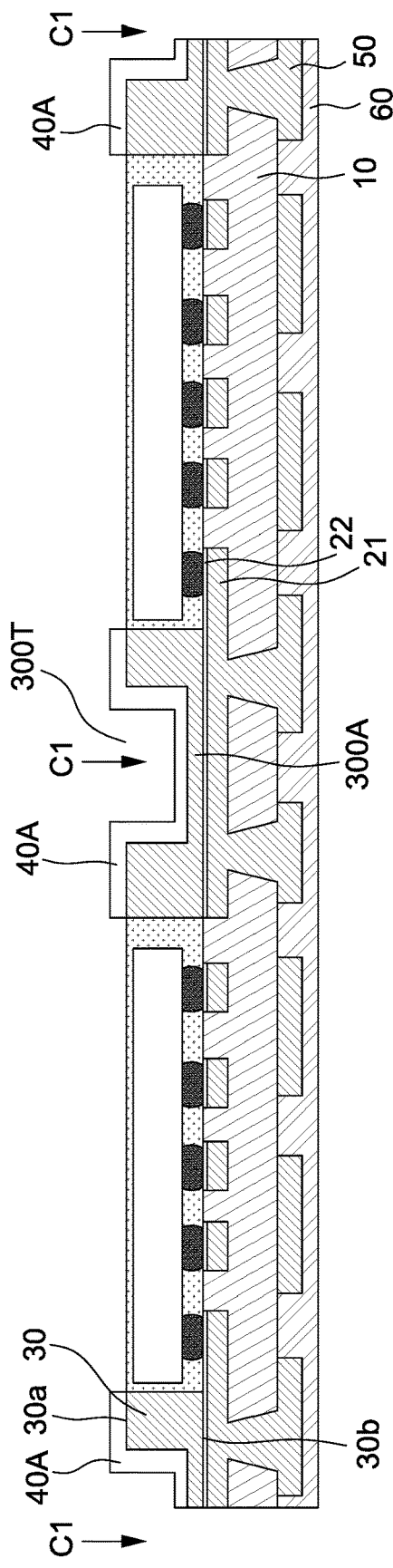
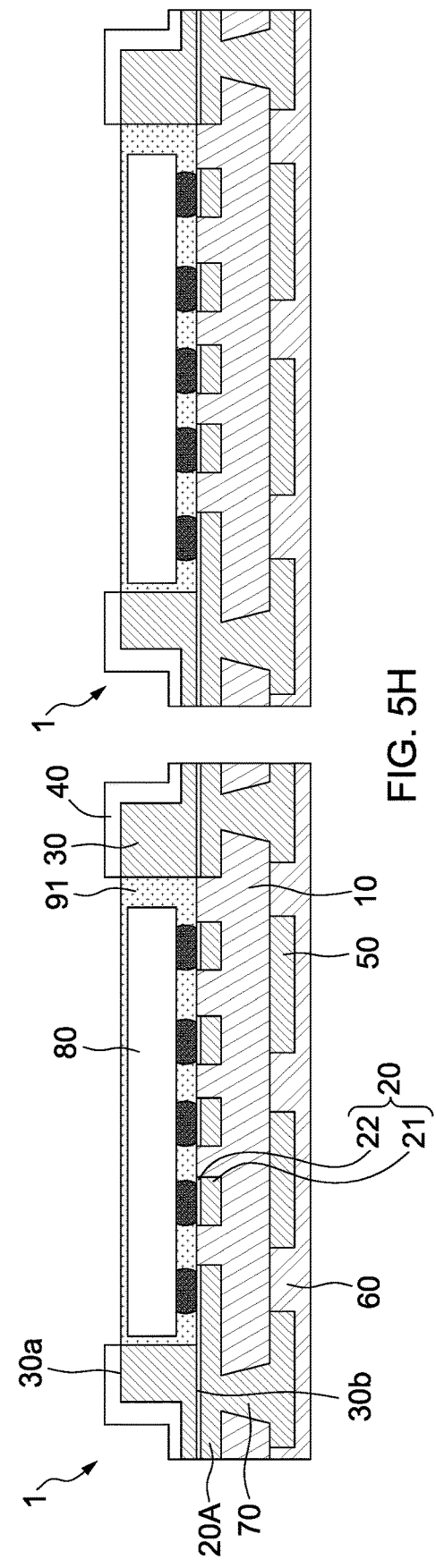
FIG. 5G
FIG. 5H

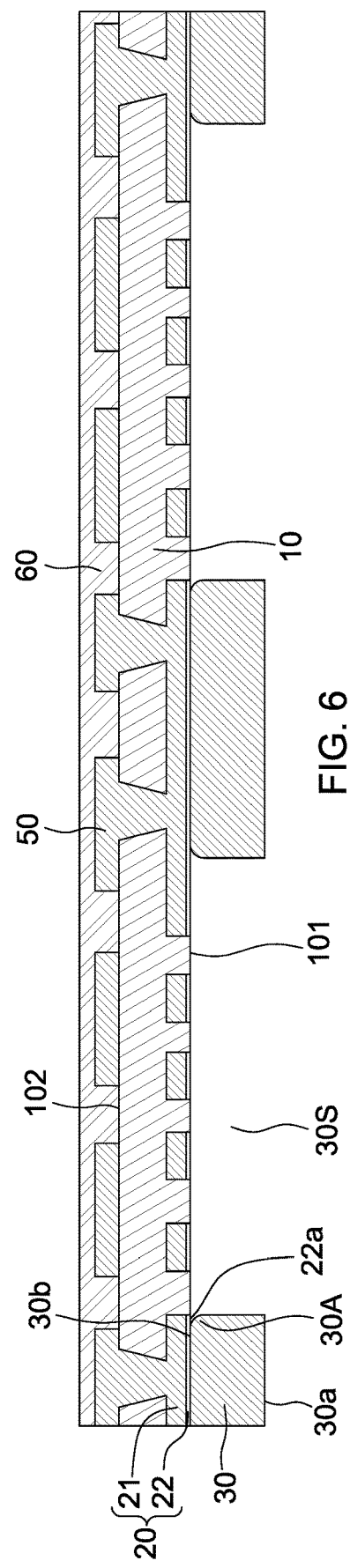

SUBSTRATE STRUCTURE, PACKAGE STRUCTURE AND METHOD FOR MANUFACTURING ELECTRONIC PACKAGE STRUCTURE

BACKGROUND

1. Technical Field

The present disclosure relates generally to a substrate structure, a package structure, and a method for manufacturing an electronic package structure.

2. Description of the Related Art

QFN packages include wettable flanks to ensure the reliability of device package especially for automotive electronics. Conventional wettable flanks are usually formed by plating, and voids may be formed in the wettable flanks during the plating process. In addition, conventional QFN packages can only provide a low-density conductive trace on a lead frame and non-multi-layer conductive trace structures, which is disadvantageous to be implemented in automotive electronics where a high-density conductive trace and a multi-layer conductive trace structure is desired by virtue of high I/O count and complex trace design. The thickness of a device package is proportional to the number of layers of conductive traces, and hence a solution that provides high density conductive traces, a multi-layer conductive trace structure, and a reduced device package thickness is required.

SUMMARY

In one or more embodiments, a substrate structure includes a dielectric layer, a trace layer, and at least one wettable flank. The dielectric layer has a first surface and a second surface opposite to the first surface. The trace layer is embedded in the dielectric layer and exposed from the first surface of the dielectric layer. The at least one wettable flank is stacked with a portion of the trace layer embedded in the dielectric layer.

In one or more embodiments, a package structure includes a dielectric layer, a trace layer, at least one wettable flank, and a die. The dielectric layer has a first surface. The trace layer is proximal to the first surface of the dielectric layer. The at least one wettable flank is on a first side of the dielectric layer. The die is on the first side of the dielectric layer.

In one or more embodiments, a method for fabricating an electronic package structure includes the following operations: forming a first patterned metal layer on a first surface of a metal substrate; removing a first portion of the metal substrate from a second surface opposite to the first surface of the metal substrate to define a space; and removing a second portion of the metal substrate from the second surface of the metal substrate to define a lateral boundary of at least one wettable flank.

BRIEF DESCRIPTION OF THE DRAWINGS

Aspects of the present disclosure are best understood from the following detailed description when read with the accompanying drawings. It is noted that various features may not be drawn to scale, and the dimensions of the various features may be arbitrarily increased or reduced for clarity of discussion.

FIG. 5A, FIG. 5B, FIG. 5C, FIG. 5D, FIG. 5E, FIG. 5F, FIG. 5G, and FIG. 5H illustrate various operations in a method of manufacturing an electronic package structure in accordance with some embodiments of the present disclosure;

FIG. 6 illustrates one or more operations in a method of manufacturing an electronic package structure in accordance with some embodiments of the present disclosure.

Common reference numerals are used throughout the drawings and the detailed description to indicate the same or similar elements. The present disclosure will be more apparent from the following detailed description taken in conjunction with the accompanying drawings.

DETAILED DESCRIPTION

Figure 1:
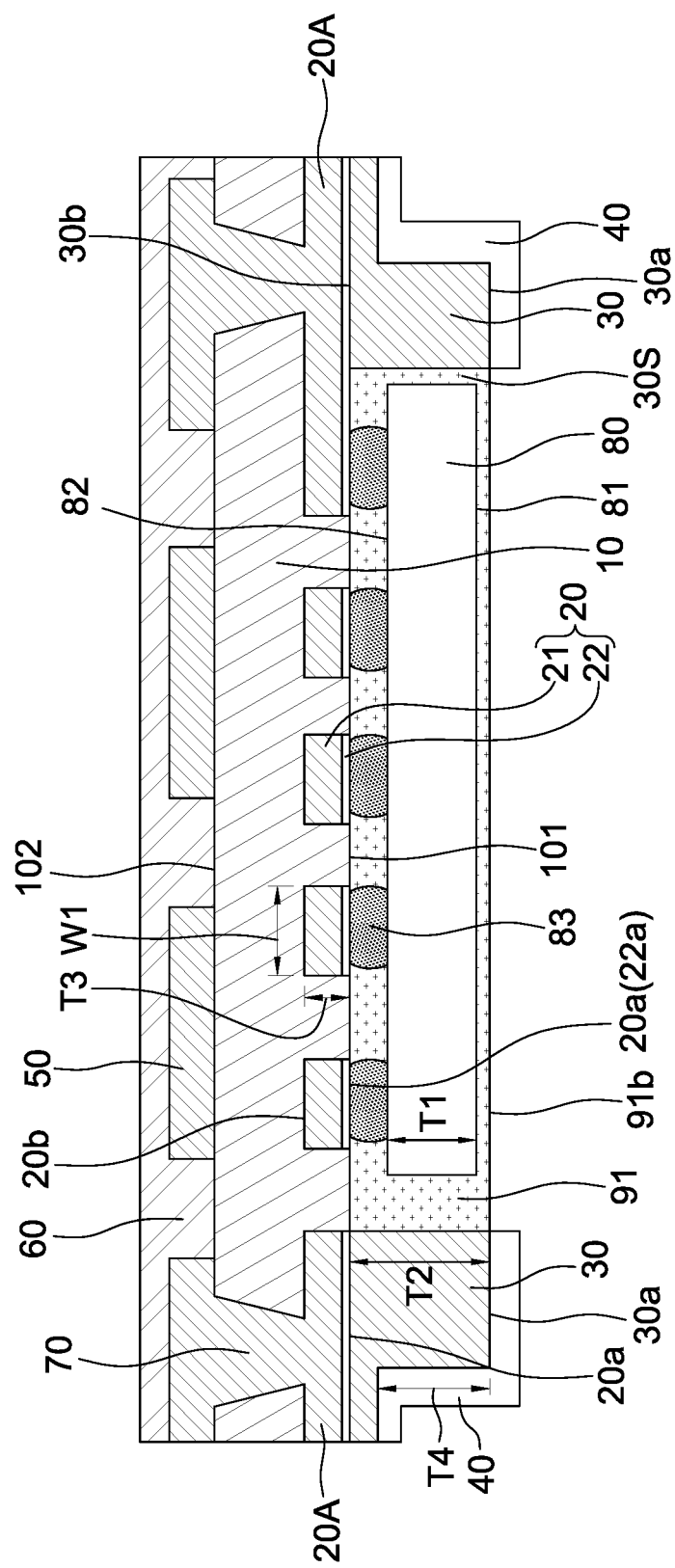
FIG. 1 illustrates a cross-sectional view of a package structure in accordance with some embodiments of the present disclosure.

FIG. 1 illustrates a cross-sectional view of a package structure 1 in accordance with some embodiments of the present disclosure. The package structure 1 includes a dielectric layer 10, a trace layer 20, one or more wettable flanks 30, a protective layer 40, a patterned metal layer 50, an insulating layer 60, one or more conductive vias 70, a die 80, and an encapsulant 91.

The dielectric layer 10 has a surface 101 and a surface 102 opposite to the surface 101. In some embodiments, the dielectric layer 10 may include, for example, but is not limited to, one or more organic materials and/or one or more inorganic materials. The organic material may be or include polyamide (PA), polyimide (PI), polybenzoxazole (PBO), an Ajinomoto build-up film (ABF), FR4, bismaleimide triazine (BT), epoxy, one or more molding compounds, any combination thereof, or the like. The inorganic material may be or include one or more pre-impregnated composite fibers (e.g., a pre-preg material), borophosphosilicate glass (BPSG), silicon oxide, silicon nitride, silicon oxynitride, undoped silicate glass (USG), any combination thereof, or the like.

The trace layer 20 may be proximal to the surface 101 of the dielectric layer 10. In some embodiments, the trace layer 20 is embedded in the dielectric layer 10 and exposed from the surface 101 of the dielectric layer 10. In some embodiments, the trace layer 20 has a surface 20a exposed from the dielectric layer 10. In some embodiments, the trace layer 20 has a surface 20b opposite to the surface 20a, and the surface 20b of the trace layer 20 is covered by the dielectric layer 10. In some embodiments, the trace layer 20 may include a circuit layer. In some embodiments, the trace layer 20 may include a patterned conductive layer. In some embodiments, the trace layer 20 may include a patterned electroplating layer. In some embodiments, a thickness T3 of the trace layer 20 is from about 10 µm to about 20 µm. In some embodiments, the thickness T3 of the trace layer 20 is about 15 µm. In some embodiments, a width W1 of the trace layer 20 is from about 10 µm to about 20 µm. In some embodiments, the width W1 of the trace layer 20 is about 15 µm. In some embodiments, the trace layer 20 may be or include a conductive material such as a metal or metal alloy. Examples include gold (Au), silver (Ag), aluminum (Al), copper (Cu), or an alloy thereof. In some embodiments, the dielectric layer 10 and the trace layer 20 form an embedded trace substrate (ETS) or an interconnection substrate.

In some embodiments, the trace layer 20 includes a patterned metal layer 21 and a barrier layer 22. In some embodiments, the barrier layer 22 may be or include an etch stop layer. In some embodiments, the barrier layer 22 is exposed from the surface 101 of the dielectric layer 10. In some embodiments, a surface 22a (e.g., the surface 20a) of the barrier layer 22 is exposed from the surface 101 of the dielectric layer 10. In some embodiments, the patterned metal layer 21 is between the barrier layer 22 and the dielectric layer 10. In some embodiments, the patterned metal layer 21 is spaced apart from the surface 101 of the dielectric layer 10 by the barrier layer 22. In some embodiments, the patterned metal layer 21 and the barrier layer 22 includes different materials. In some embodiments, the patterned metal layer 21 may be or include a metal or metal alloy, such as Au, Ag, Al, Cu, or an alloy thereof. In some embodiments, the barrier layer 22 may be or include nickel (Ni), titanium (Ti), platinum (Pt), chromium (Cr), tantalum (Ta), tungsten (W), molybdenum (Mo), tin (Sn), stainless steel, Ni/Au, plated Au, or an alloy thereof. In some embodiments, the patterned metal layer 21 is or includes a patterned electroplating layer. In some embodiments, the barrier layer 22 is or includes a patterned electroplating layer.

The wettable flank 30 may be disposed proximal to the surface 101 of the dielectric layer 10. In some embodiments, the wettable flank 30 is disposed on the surface 101 of the dielectric layer 10. In some embodiments, the wettable flank 30 is stacked with a portion 20A of the trace layer 20 embedded in the dielectric layer 10. In some embodiments, the wettable flank 30 is in direct contact with the portion 20A of the trace layer 20 embedded in the dielectric layer 10. In some embodiments, the wettable flank 30 is on a side (e.g., the side adjacent to the surface 101) of the dielectric layer 10. In some embodiments, the wettable flank 30 is in contact with the surface 20a of the trace layer 20. In some embodiments, the wettable flank 30 is in contact with the barrier layer 22 of the trace layer 20. In some embodiments, the wettable flank 30 has a surface 30a facing away from the surface 101 of the dielectric layer 10 and a surface 30b opposite to the surface 30a. In some embodiments the surface 30b of the wettable flank 30 is in contact with the surface 20a of the portion 20A of the trace layer 20. In some embodiments, the patterned metal layer 21 is between the wettable flank 30 and the dielectric layer 10.

In some embodiments, a thickness T2 of the wettable flank 30 is from about 80 µm to about 250 µm. In some embodiments, the thickness T2 of the wettable flank 30 is from about 100 µm to about 200 µm. In some embodiments, the thickness T2 of the wettable flank 30 is from about 100 µm to about 150 µm. In some embodiments, the wettable flank 30 has a stepped structure having a stepped depth T4, and the stepped depth T4 is from about 80 µm to about 120 µm. In some embodiments, the stepped depth T4 of the wettable flank 30 is about 100 µm.

In some embodiments, the wettable flank 30 includes a metal layer such as a copper layer and/or a lead frame. In some embodiments, the wettable flank 30 includes a portion of a rolled lead frame. In some embodiments, the wettable flank 30 includes a portion of a rolled copper foil. In some embodiments, the wettable flank 30 is substantially free of void. In some embodiments, the wettable flank 30 includes rolled metal grains. In some embodiments, the wettable flank 30 includes rolled copper (RC) grains.

In some embodiments, the package structure 1 may include at least two wettable flanks 30. In some embodiments, the surfaces 30a of the at least two wettable flanks 30 facing away from the surface 101 of the dielectric layer 10 are substantially coplanar. In some embodiments, two adjacent wettable flanks 30 define a space 30S (also referred to as "a cavity" or "an opening"). In some embodiments, two adjacent wettable flanks 30 and the dielectric layer 10 define the space 30S. In some embodiments, a portion of the trace layer 20 is exposed from the space 30S. In some embodiments, a portion of the surface 101 of the dielectric layer 10 is exposed from the space 30S. In some embodiments, the dielectric layer 10, the trace layer 20, and the wettable flank(s) 30 form a substrate structure including an embedded trace substrate (ETS).

The protective layer 40 may be disposed on the wettable flank 30. In some embodiments, the protective layer 40 covers the surface 30a of the wettable flank 30. The protective layer 40 may be an anti-oxidization film configured to prevent the wettable flank 30 from being oxidized. The protective layer 40 may also help to increase wetting of the wettable flank 30, such that solder materials can climb up the wettable flank 30. In some embodiments, the protective layer 40 may include a single-layered wetting layer. In some embodiments, the protective layer 40 may include a solder-wettable material such as nickel/gold, nickel/palladium, solder or a mixture thereof. In some embodiments, the protective layer 40 may include a metal finish such as nickel/gold or nickel/palladium. In some other embodiments, the protective layer 40 may include an organic solderability preservative (OSP).

The patterned metal layer 50 may be disposed on the surface 102 of the dielectric layer 10. In some embodiments, the patterned metal layer 50 and the wettable flank 30 are disposed on two opposite sides of the dielectric layer 10. In some embodiments, the patterned metal layer 50 and the wettable flank 30 are disposed on two opposite sides of the embedded trace substrate (i.e., the dielectric layer 10 and the trace layer 20). In some embodiments, the patterned metal layer 50 includes an antenna structure.

The insulating layer 60 may be stacked with the surface 102 of the dielectric layer 10. In some embodiments, the insulating layer 60 covers the patterned metal layer 50. In some embodiments, the insulating layer 60 includes silicon oxide, silicon nitride, gallium oxide, aluminum oxide, scandium oxide, zirconium oxide, lanthanum oxide, hafnium oxide, or any combination thereof.

The one or more conductive vias 70 may pass through the dielectric layer 10. In some embodiments, the conductive via 70 is connected to the trace layer 20. In some embodiments, the conductive via 70 is connected to a portion of the patterned metal layer 50. In some embodiments, the conductive via 70 is electrically connected to the trace layer 20 and a portion of the patterned metal layer 50. In some embodiments, the conductive via 70 and a portion of the trace layer 20 form a shielding structure. Accordingly, a reliable EMI shielding can be provided by the shielding structure formed from the conductive via 70 and the trace layer 20 without forming an additional shielding structure by sputtering or plating in the package structure 1. Therefore, the overall size of the package structure 1 is reduced, the overall manufacturing process of the package structure 1 is simplified, and the reliability of the package structure 1 is increased due to omitting the additional process for forming an additional shielding structure and avoiding the possible processing errors caused by the additional process.

The die 80 may be disposed on a side (i.e., the side adjacent to the surface 101) of the dielectric layer 10. In some embodiments, the die 80 and the wettable flank 30 are disposed at the same side (i.e., the side adjacent to the surface 101) of the dielectric layer 10. In some embodiments, the die 80 and the wettable flank 30 are disposed at the same side (i.e., the side adjacent to the surface 101) of the embedded trace substrate. In some embodiments, the die 80 is disposed in the space 30S of the wettable flank 30. In some embodiments, a thickness T1 of the die 80 is equal to or less than a thickness T2 of the wettable flank 30. In some embodiments, the thickness T1 of the die 80 is from about 50 μm to about 100 μm. In some embodiments, a backside surface (i.e., the surface 81) of the die 80 is free from protruding out of the surface 30a of the wettable flank 30. According to some embodiments of the present disclosure, with the aforesaid design of the die 80 and the wettable flank 30, the overall thickness of the package structure 1 can be reduced, such as to about 150 μm or less, and the space utilization of the package structure 1 can be improved.

In some cases where wettable flanks are stacked over a die and a molding compound encapsulating the die, the device package may have an excess device package thickness which is disadvantageous for high I/O automotive electronic application. In contrast, according to some embodiments of the present disclosure, the overall thickness of the package structure 1 can be reduced by the wettable flanks 30 having the space 30S for accommodating the die 80, and thus it is advantageous to high I/O automotive electronic application. In addition, according to some embodiments of the present disclosure, the die 80 and the wettable flank 30 are disposed at the same side of the embedded trace substrate, and thus the antenna structure (e.g., the patterned metal layer 50) can be disposed on the other side of the embedded trace substrate, such that the signals transmitted to the antenna structure can be prevented from being adversely affected by the trace layer 20. Therefore, the die 80, the wettable flank 30 and the antenna structure can be integrated in the one single package structure 1.

In some embodiments, the die 80 is connected to the trace layer 20 through flip-chip technique. In some embodiments, the die 80 is electrically connected to the trace layer 20 through conductive elements 83, such as conductive bumps. In some embodiments, the conductive elements 83 are disposed in the space 30S of the wettable flank 30 and connected to an active surface (i.e., the surface 82) of the die 80. Therefore, the overall thickness of the package structure 1 can be reduced, such as to about 150 μm or less, and the space utilization of the package structure 1 can be improved. In some embodiments, the conductive bumps may be or include Au, Ag, Cu, another metal, a solder alloy, or a combination of two or more thereof.

The encapsulant 91 may encapsulates the die 80. In some embodiments, the encapsulant 91 fills the space 30S of the wettable flank 30. In some embodiments, the encapsulant 91 and the wettable flank 30 are disposed at the same side (i.e., the side adjacent to the surface 101) of the dielectric layer 10. In some embodiments, the encapsulant 91 and the wettable flank 30 are disposed at the same side (i.e., the side adjacent to the surface 101) of the embedded trace substrate. In some embodiments, the encapsulant 91 may include an epoxy resin having fillers, a molding compound (e.g., an epoxy molding compound or other molding compound), polyimide, a phenolic compound or material, a material with a silicone dispersed therein, or a combination thereof.

Figure 2:
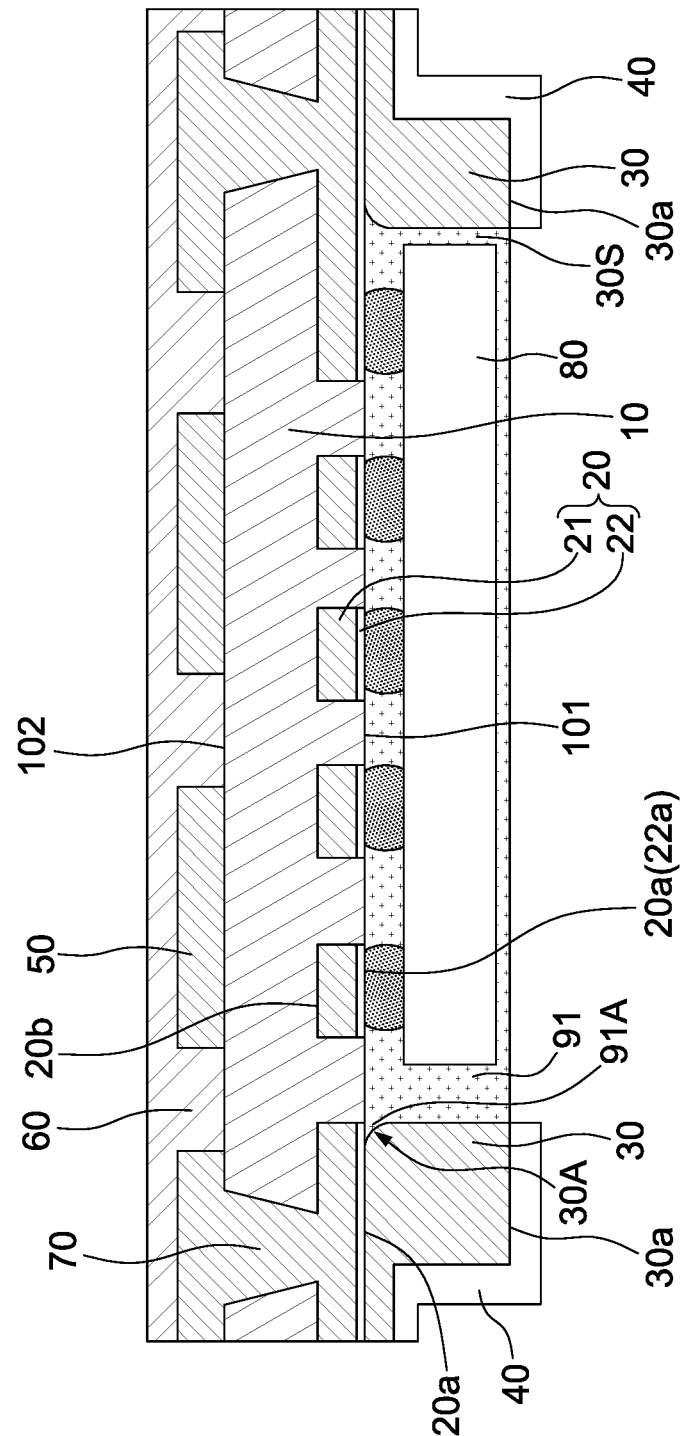
FIG. 2 illustrates a cross-sectional view of a package structure in accordance with some embodiments of the present disclosure.

FIG. 2 illustrates a cross-sectional view of a package structure 2 in accordance with some embodiments of the present disclosure. The package structure 2 is similar to the package structure 1 in FIG. 1 except that, for example, the wettable flank 30 has a different structure.

In some embodiments, the wettable flank 30 has a curved corner 30A proximal to the surface 20a of the trace layer 20. In some embodiments the curved corner 30A of the wettable flank 30 is proximal to the barrier layer 22. In some embodiments, the curved corner 30A of the wettable flank 30 is proximal to the surface 101 of the dielectric layer 10.

In some embodiments, a protruding portion 91A of the encapsulant 91 is in contact with the curved corner 30A of the wettable flank 30. In some embodiments, the protruding portion 91A of the encapsulant 91 is between the barrier layer 22 and the curved corner 30A of the wettable flank 30. In some embodiments, the protruding portion 91A of the encapsulant 91A conforms to the morphology of the curved corner 30A of the wettable flank 30.

Figure 3:
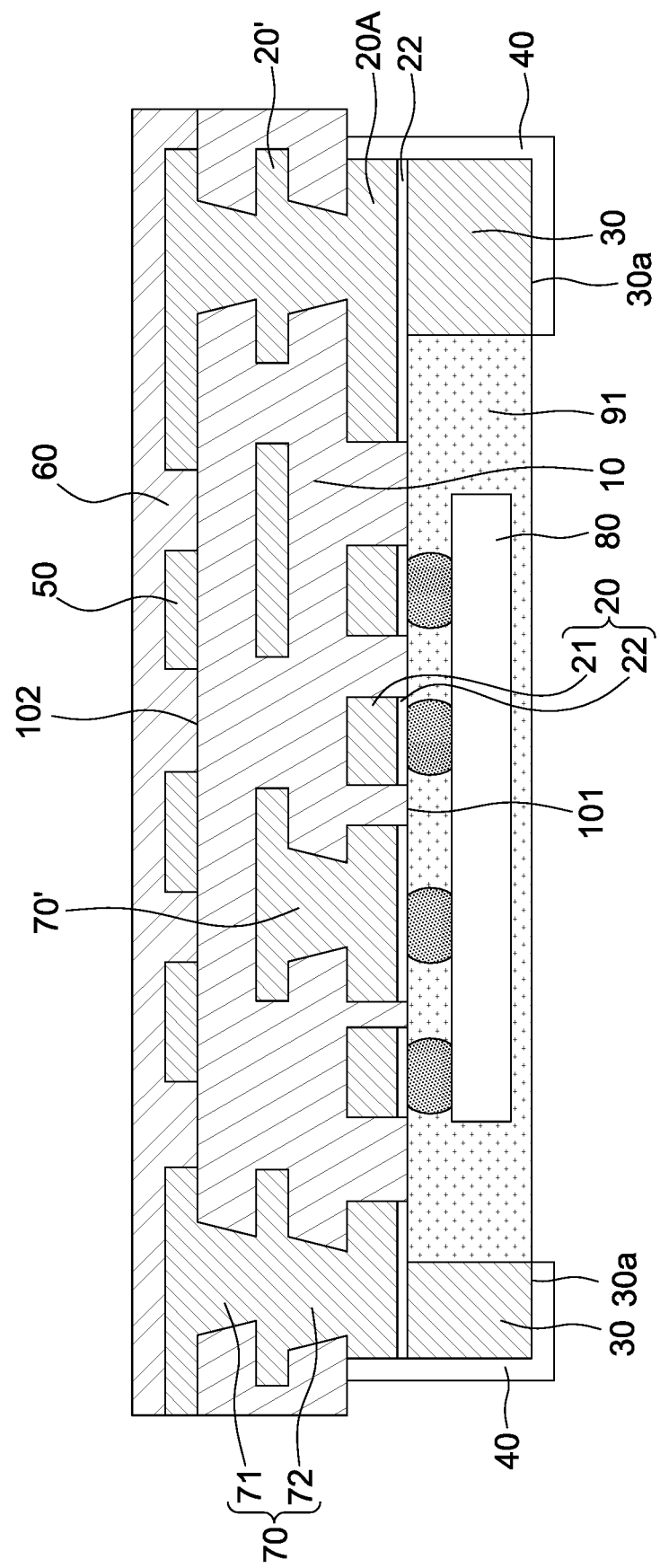
FIG. 3 illustrates a cross-sectional view of a package structure in accordance with some embodiments of the present disclosure.

FIG. 3 illustrates a cross-sectional view of a package structure 3 in accordance with some embodiments of the present disclosure. The package structure 3 is similar to the package structure 1 in FIG. 1 except that, for example, the package structure 3 further includes one or more trace layers 20' within the dielectric layer 10.

In some embodiments, the trace layer 20' is fully embedded in the dielectric layer 10. In some embodiments, the conductive via 70 electrically connecting the patterned metal layer 50 to the trace layer 20 includes conductive vias 71 and 72. In some embodiments, the trace layer 20' is electrically connected to the trace 20 through one or more conductive vias 70' or the conductive via 72. In some embodiments, the trace layer 20' is electrically connected to a portion of the patterned metal layer 50 through the conductive via 71. In some embodiments, the dielectric layer 10 and the trace layers 20 and 20' form an embedded trace substrate (ETS) or an interconnection substrate.

In some embodiments, the protective layer 40 further covers a lateral surface of the trace layer 20 (i.e., the portion 20A). In some embodiments, the protective layer 40 further covers a lateral surface of the barrier layer 22. In some embodiments, the protective layer 40 is in contact with a portion of the surface 101 of the dielectric layer 10.

Figure 4A:
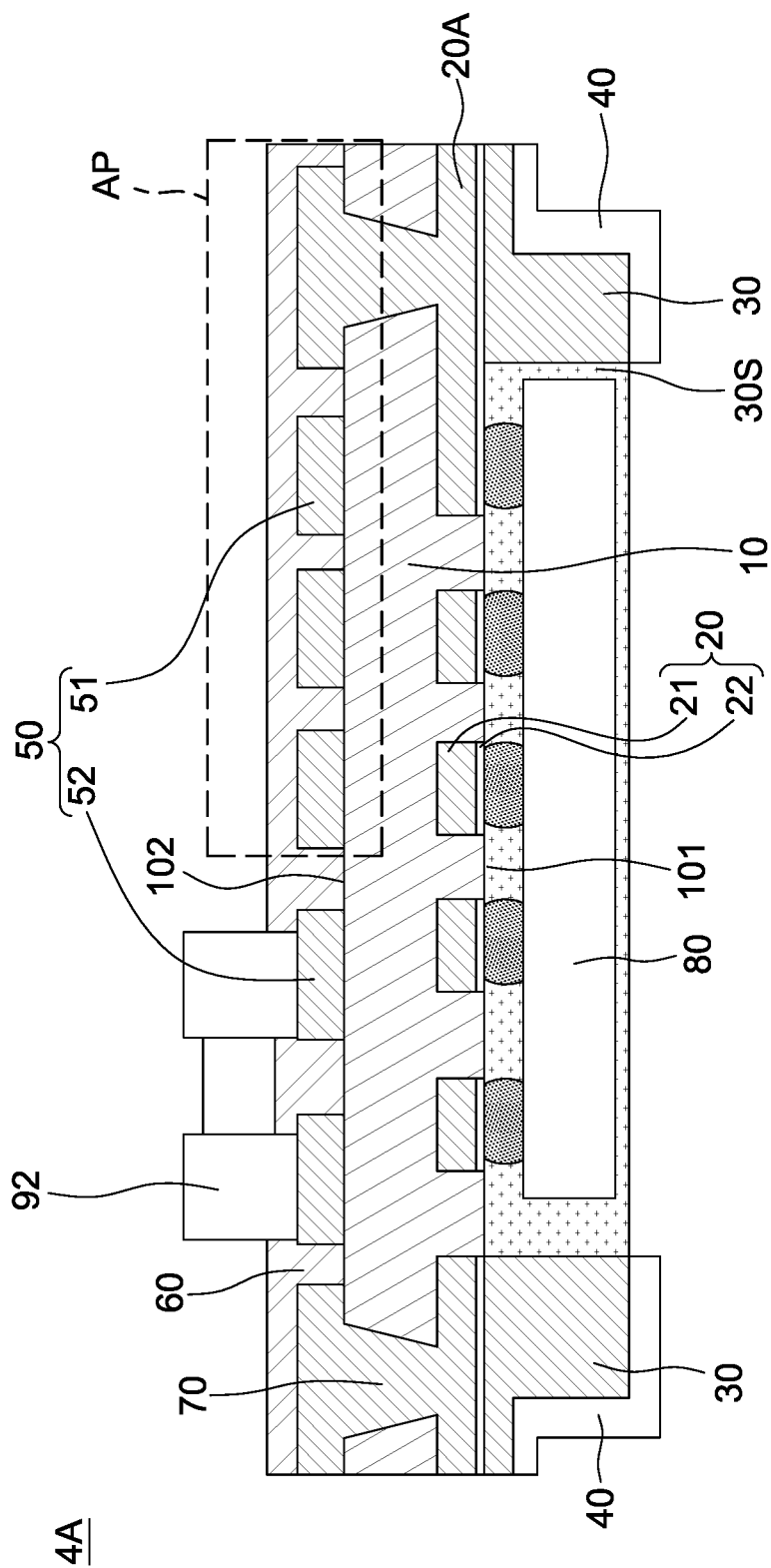
FIG. 4A illustrates a cross-sectional view of a package structure in accordance with some embodiments of the present disclosure.

FIG. 4A illustrates a cross-sectional view of a package structure 4A in accordance with some embodiments of the present disclosure. The package structure 4A is similar to the package structure 1 in FIG. 1 except that, for example, the package structure 4A further includes an electronic component 92.

In some embodiments, the electronic component 92 is disposed on the surface 102 of the dielectric layer 10. In some embodiments, the patterned metal layer 50 includes portions 51 and 52. In some embodiments, the portion 51 of the patterned metal layer 50 includes an antenna structure AP, and the portion 52 of the patterned metal layer 50 includes conductive pads. In some embodiments, the electronic component 92 is electrically connected to the conductive pads (i.e., the portion 52 of the patterned metal layer 50). In some embodiments, the electronic component 92 and the antenna structure AP are both disposed on the surface 102 of the dielectric layer 10. In some embodiments, the electronic component 92 may include one or more passive devices, such as a resistor, a capacitor, an inductor, or a combination thereof. In some embodiments, the package structure 4A may be referred to as an antenna-on-package (AoP) structure.

According to some embodiments of the present disclosure, the die 80 and the wettable flank 30 are disposed at the same side of the dielectric layer 10 (or the embedded trace substrate), and thus the antenna structure AP and the electronic component 92 can be further disposed on the other side of the dielectric layer 10 (or the embedded trace substrate), such that the signals transmitted to the antenna structure AP can be prevented from being adversely affected by the trace layer 20. Therefore, the die 80, the wettable flank 30, the antenna structure AP and the electronic component 92 can be integrated in the one single package structure 4A.

Figure 4B:
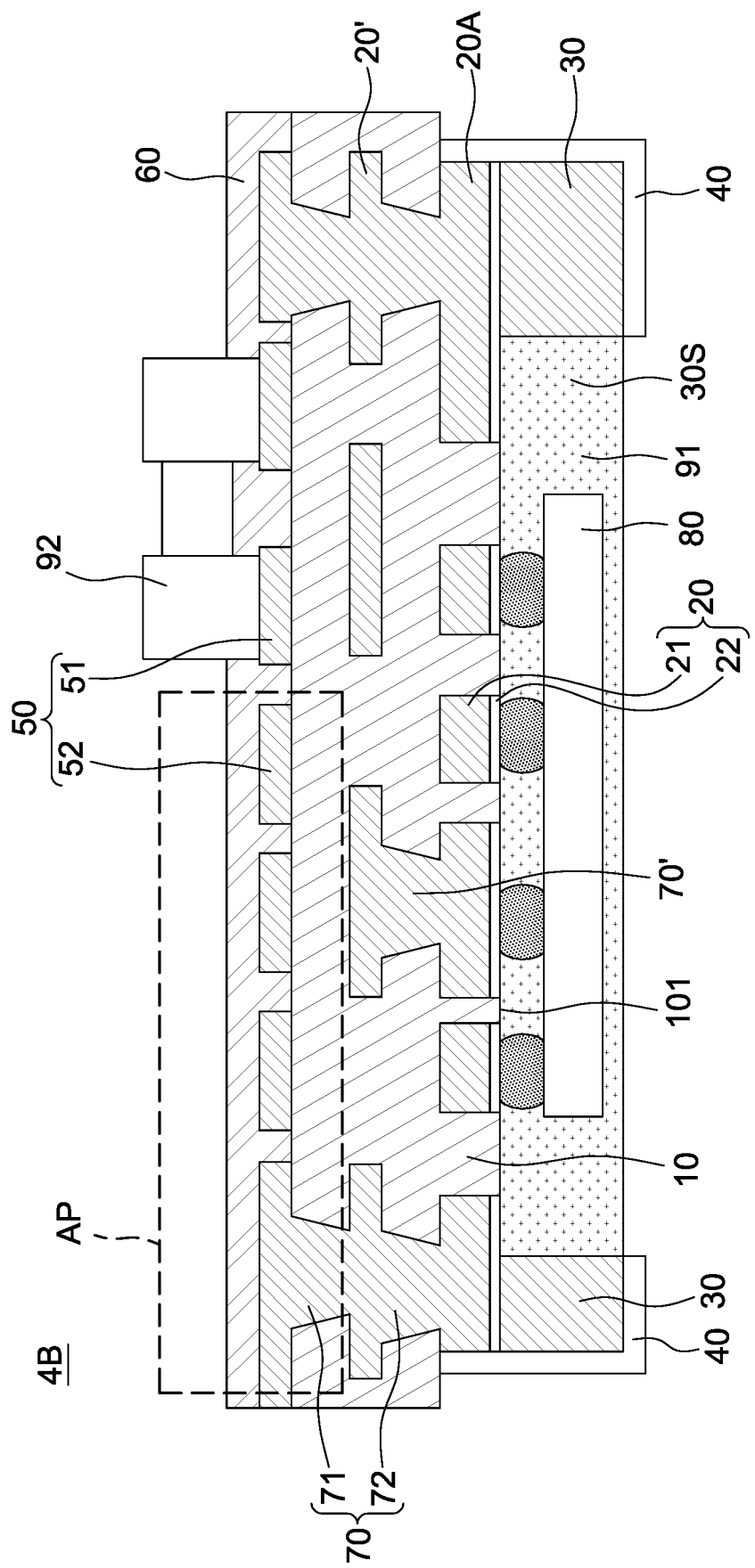
FIG. 4B illustrates a cross-sectional view of a package structure in accordance with some embodiments of the present disclosure.

FIG. 4B illustrates a cross-sectional view of a package structure 4B in accordance with some embodiments of the present disclosure. The package structure 4B is similar to the package structure 4A in FIG. 4A except that, for example, the package structure 4B further includes one or more trace layers 20' within the dielectric layer 10.

In some embodiments, the package structure 4B further includes conductive vias 71, 72, and 70. The description of the trace layer 20' and the conductive vias 71, 72, and 70 is similar to those illustrated in FIG. 3 and thus is omitted hereinafter. In some embodiments, the package structure 4B may be referred to as an antenna-on-package (AoP) structure.

Figure 4C:
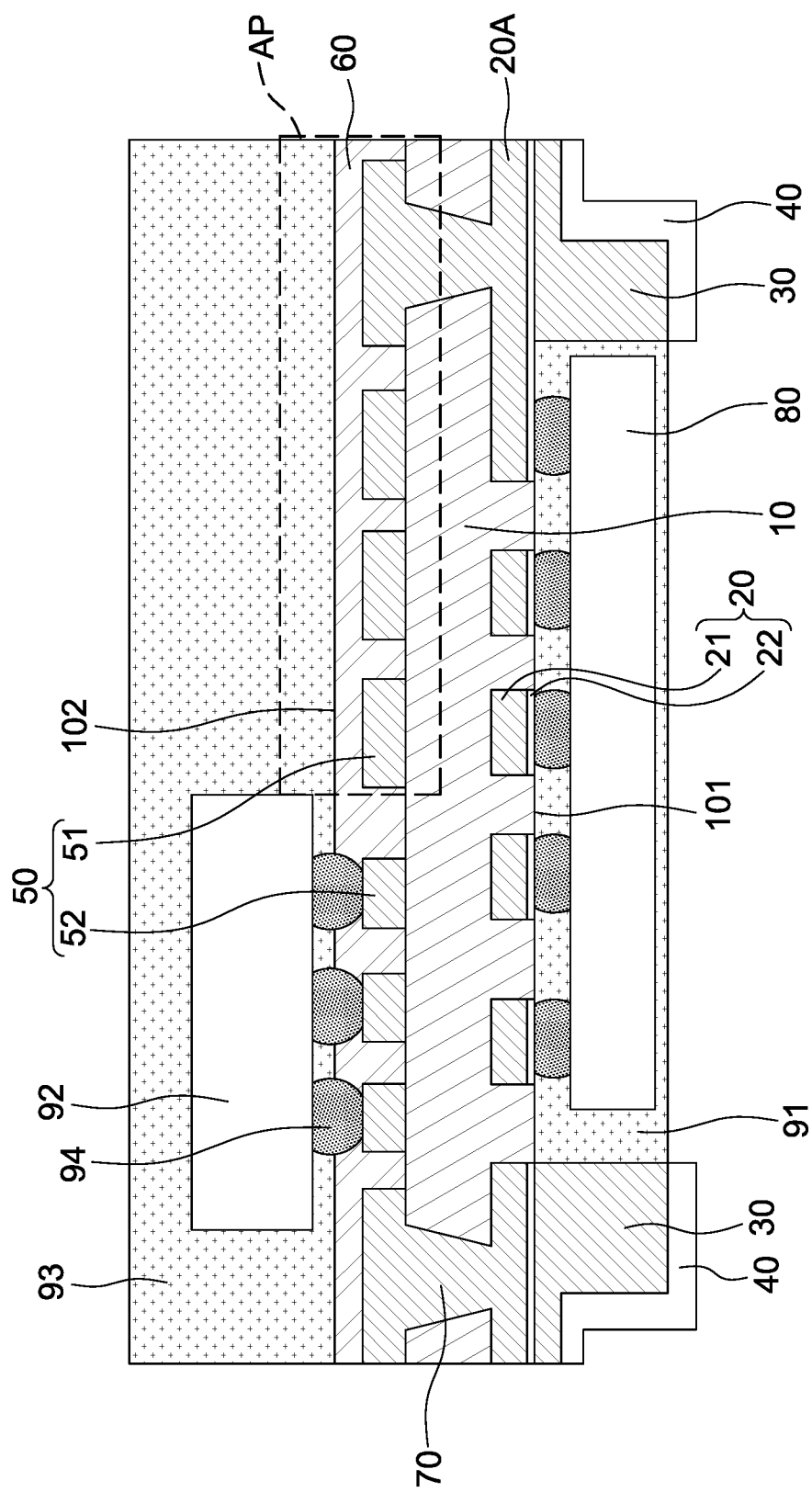
FIG. 4C illustrates a cross-sectional view of a package structure in accordance with some embodiments of the present disclosure.

FIG. 4C illustrates a cross-sectional view of a package structure 4C in accordance with some embodiments of the present disclosure. The package structure 4C is similar to the package structure 1 in FIG. 1 except that, for example, the package structure 4C further includes an electronic component 92 and an encapsulant 93.

In some embodiments, the portion 51 of the patterned metal layer 50 includes an antenna structure AP, and the portion 52 of the patterned metal layer 50 includes conductive pads electrically connected to the electronic component 92. In some embodiments, the electronic component 92 is electrically connected to the conductive pads (i.e., the portion 52) through conductive elements 94, such as conductive bumps. In some embodiments, the conductive bumps may be or include Au, Ag, Cu, another metal, a solder alloy, or a combination of two or more thereof. In some embodiments, the electronic component 92 may include one or more passive devices, such as a resistor, a capacitor, an inductor, or a combination thereof.

In some embodiments, the encapsulant 93 is disposed on the surface 102 of the dielectric layer 10. In some embodiments, the encapsulant 93 is disposed on the insulating layer 60. In some embodiments, the encapsulant 93 encapsulates the electronic component 92 and the antenna structure AP. In some embodiments, the encapsulant 91 and the encapsulant 93 are disposed on two opposite sides of the dielectric layer 10. In some embodiments, the encapsulant 91 and the encapsulant 93 are disposed on two opposite sides of the embedded trace substrate. In some embodiments, the package structure 4C may be referred to as an antenna-in-package (AiP) structure.

Figure 4D:
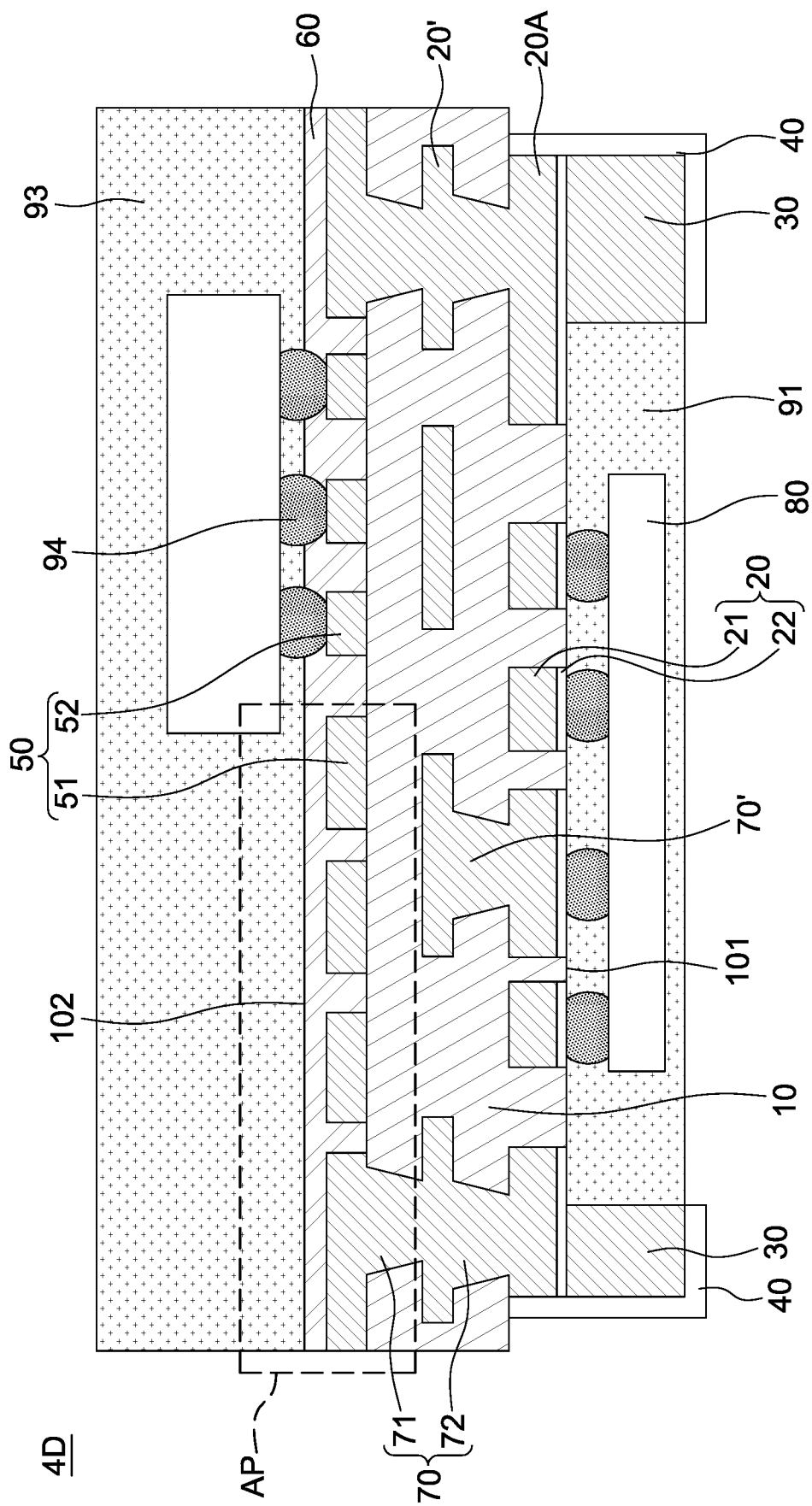
FIG. 4D illustrates a cross-sectional view of a package structure in accordance with some embodiments of the present disclosure.

FIG. 4D illustrates a cross-sectional view of a package structure 4D in accordance with some embodiments of the present disclosure. The package structure 4D is similar to the package structure 4C in FIG. 4C except that, for example, the package structure 4D further includes one or more trace layers 20' within the dielectric layer 10. In some embodiments, the package structure 4D may be referred to as an antenna-in-package (AiP) structure.

In some embodiments, the package structure 4D further includes conductive vias 71, 72, and 70. The description of the trace layer 20' and the conductive vias 71, 72, and 70 is similar to those illustrated in FIG. 3 and thus is omitted hereinafter.

FIG. 5A, FIG. 5B, FIG. 5C, FIG. 5D, FIG. 5E, FIG. 5F, FIG. 5G, and FIG. 5H illustrate various operations in a method of manufacturing a package structure 1 in accordance with some embodiments of the present disclosure.

Referring to FIG. 5A, a metal substrate 300 may be provided. The metal substrate 300 has a surface 300a and a surface 300b opposite to the surface 300b. In some embodiments, the surface 300a is a substantially planar surface. In some embodiments, the surface 300b is a substantially planar surface. In some embodiments, the metal substrate 300 may be or include a lead frame or a copper foil. In some embodiments, the metal substrate 300 may be or include a rolled lead frame or a rolled copper foil.

Referring to FIG. 5B, a patterned film 501 may be formed on the surface 300b of the metal substrate 300, and a patterned metal layer 21 may be formed on the metal substrate 300. In some embodiments, a barrier layer 22 may be formed on the surface 300b of the metal substrate 300, and the patterned metal layer 21 may be formed on the barrier layer 22. In some embodiments, the patterned film 501 defines a plurality of openings to exposes portions of the surface 300b of the metal substrate 300 prior to forming the barrier layer 22. Then, the barrier layer 22 is formed on the portions of the surface 300b of the metal substrate 300 exposed from the openings of the patterned film 501. In some embodiments, the patterned film 501 may be or include a dry film resist. In some embodiments, the patterned metal layer 21 is formed by an electroplating process. In some embodiments, the barrier layer 22 is formed by an electroplating process. In some embodiments, since the barrier layer 22 is an electroplated layer, the barrier layer 22 includes metal grains (e.g., copper grains) without preferred texture, for example, the dimensions of the metal grains are substantially identical in every directions. In some embodiments, the patterned metal layer 21 and the barrier layer 22 form a trace layer 20. In the cases where trace layers are formed by etching technique, the as-formed trace layers have relatively wide line width/line space (L/S) due to the processing limits of etching processes. In contrast, according to some embodiments of the present disclosure, the trace layer 20 is formed by electroplating, and thus a high-density trace layer capable of providing high I/O counts can be formed, which is advantageous to achieve complex trace design.

Referring to FIG. 5C, a dielectric layer 10 may be formed on the patterned metal layer 21. In some embodiments, the dielectric layer 10 is formed to cover the surface 300b of the metal substrate 300 and the patterned metal layer 21, and is then patterned to form openings 10a (also referred to as "via holes") to expose portions of the patterned metal layer 21. In some embodiments, the dielectric layer 10 has a surface 101 facing the metal substrate 300 and a surface 102 having the openings 10a.

Referring to FIG. 5D, a patterned metal layer 50 may be formed on the dielectric layer 10, and an insulating layer 60 may be formed on the patterned metal layer 50. In some embodiments, a metal material may be formed over the surface 102 of the dielectric layer 10 and filled in the openings 10a (or the via holes) of the dielectric layer 10 so as to form through vias 70 passing through the dielectric layer 10. The metal material over the surface 102 of the dielectric layer 10 may be further patterned so as to form the patterned metal layer 50. In some embodiments, the patterned metal layer 50 is electrically connected to the patterned metal layer 21. In some embodiments, the insulating layer 60 is formed over the patterned metal layer 21.

Figure 5E:
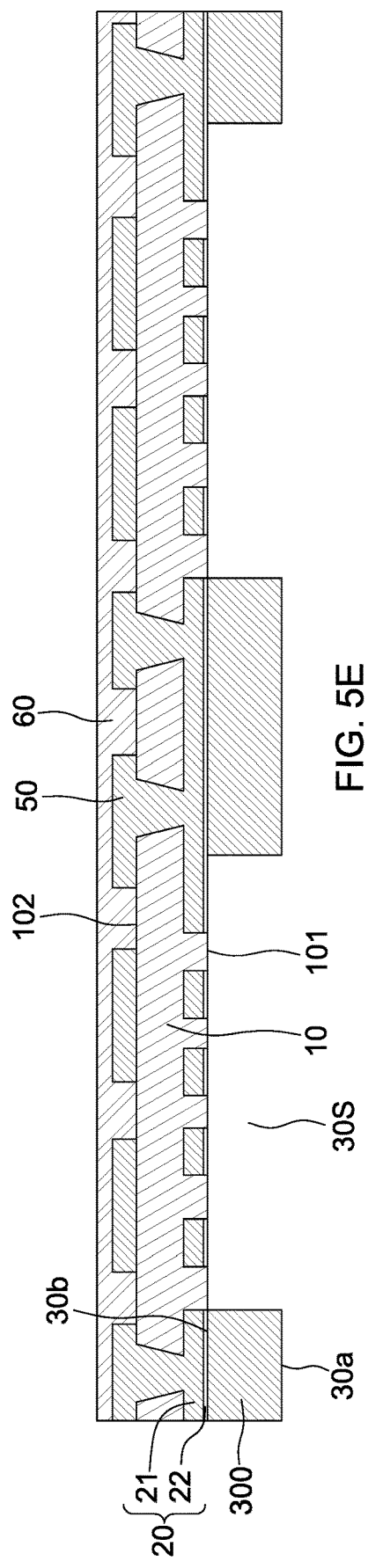

Referring to FIG. 5E, a portion of the metal substrate 300 may be removed from the surface 300a of the metal substrate 300 to define one or more spaces 30S. In some embodiments, the metal substrate 300 may be etched from the surface 300a of the metal substrate 300 to define one or more spaces 30S. In some embodiments, the metal substrate 300 is etched by an etchant that has a relatively high etching selectivity of etching the metal substrate 300 relative to etching the barrier layer 22. Therefore, the patterned metal layer 21 underneath the barrier layer 21 can be protected from damage by the etchant. In addition, the spaces 30S are formed by etching away one or more portions of the metal substrate 300, and thus the remains portions (i.e., the surfaces 30a) of the surface 300a are substantially coplanar.

Figure 5F:
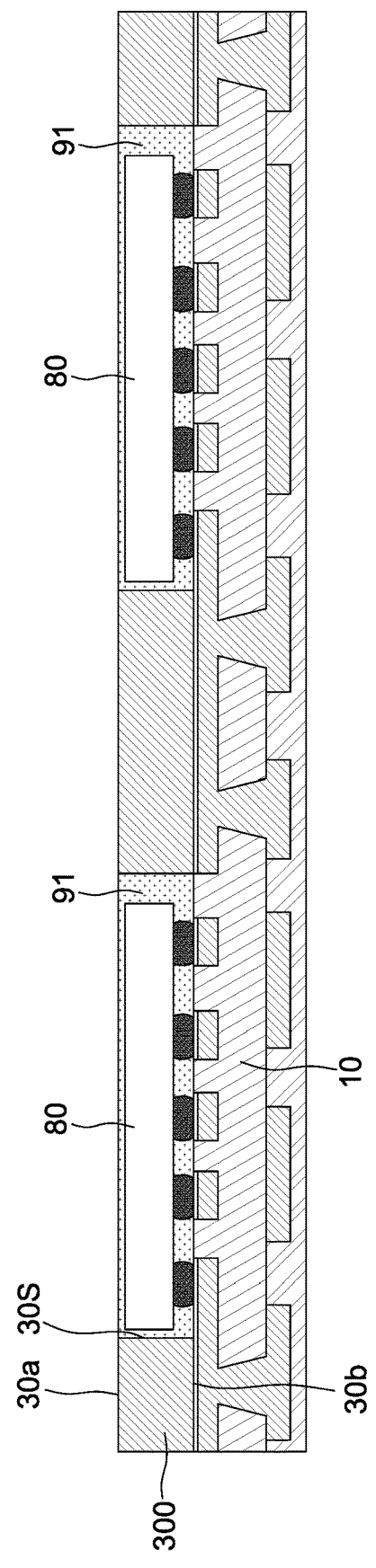

Referring to FIG. 5F, the structure shown in FIG. 5E is flipped over, one or more dies 80 may be disposed in the one or more spaces 30S and electrically connected to the patterned metal layer 21, and one or more encapsulants 91 may be formed in the one or more spaces 30S. In some embodiments, the encapsulant 91 encapsulates the die 80 within the space 30S.

Referring to FIG. 5G, a portion of the metal substrate 300 may be removed from the surface 30a of the metal substrate 300 to define a lateral boundary of at least one wettable flank 30. In some embodiments, a half-cut operation C1 may be performed on the metal substrate 300 from the surface 30a of the metal substrate 300 to define a lateral boundary of at least one wettable flank 30, and then a protective layer 40A may be formed on the wettable flank 30. In some embodiments, a plurality of wettable flanks 30 may be formed by the half-cut operation C1, and a plurality of protective layers 40A may be formed on respective regions of the wettable flanks 30. In some embodiments, the half-cut operation C1 defines at least two lateral boundaries of at least two wettable flanks 30. In some embodiments, a trench 300T defined by the lateral boundaries of at least two adjacent wettable flanks 30 may be formed by the half-cut operation C1. In some embodiments, the trench 300T does not penetrate through the metal substrate 300, such that the bottom surface of the trench 300T is distant from the surface 30b of the metal substrate 300. In some embodiments, the metal substrate 300 is a rolled copper (RC) layer, and the wettable flank 30 is formed by etching the metal substrate 300 instead of electroplating a patterned copper layer, thus the wettable flank 30 includes rolled copper (RC) grains. Typically the RC grains show a preferred texture, for example, the dimensions of the metal grains are especially greater in some preferred directions associated with the rolling and annealing manufacturing process of said metal substrate 300.

In some embodiments, after the half-cut operation C1 is performed, two adjacent wettable flanks 30 are connected to each other by a remained portion 300A of the metal substrate 300. In some embodiments, the protective layers 40A are formed by electroplating. In some embodiments, the remained portion 300A of the metal substrate 300 connecting the wettable flanks 30 serves as the conductive path for a current to pass through the entire metal substrate 300, and thus the plurality of protective layers 40A can be formed in one electroplating operation.

In some embodiments, the half-cut operation C1 may be performed by cutting through a portion of the metal substrate 300 to form the trench 300T defined by the lateral boundaries of at least two adjacent wettable flanks 30. The width of the trench 300T may be defined by the width of the cutting apparatus used for cutting the metal substrate 300. According to some embodiments of the present disclosure, the wettable flanks 30 formed by cutting is advantageous to simplifying the manufacturing process.

In some other embodiments, the half-cut operation C1 may be performed by an etching process. For example, a patterned mask layer having an opening may be disposed over the surface 30a of the metal substrate 300 to define the position where the trench 300T is to be formed, and the metal substrate 300 may be etched from the surface 30a according to the patterned mask layer, the opening of the patterned mask layer defining the shape and the position of the trench 300T. According to some embodiments of the present disclosure, the wettable flanks 30 formed by etching is advantageous to the design flexibility of the shape and the position of the trench 300T, thereby the design flexibility of the morphology of the wettable flank 30 can be increased.

Referring to FIG. 5H, a singulation operation is performed to separate the structure shown in FIG. 5G into singulated structures (i.e., package structures 1). In some embodiments, the singulation operation may be performed by cutting through the insulating layer 60, the dielectric layer 10, the patterned metal layer 21, the barrier layer 22, and the remained portion 300A of the metal substrate 300 to form the singulated package structures 1 (i.e., singulated electronic package structures). In some embodiments, each of the singulated package structures 1 include at least one wettable flank 30.

FIG. 6 illustrate one or more operations in a method of manufacturing a package structure 2 in accordance with some embodiments of the present disclosure.

Operations illustrated in FIGS. 5A-5D are performed to form the structure shown in FIG. 5D. Next, referring to FIG. 6, the metal substrate 300 may be etched from the surface 30a of the metal substrate 300 to define one or more spaces 30S. In some embodiments, the metal substrate 300 is etched by an etchant that has a relatively high etching selectivity of etching the metal substrate 300 relative to etching the barrier layer 22. Therefore, the patterned metal layer 21 underneath the barrier layer 21 can be protected from damage by the etchant. In some embodiments, the metal substrate 300 may be over-etched to form a curved corner 30A proximal to the surface 22a of the barrier layer 22. In some embodiments, a portion of the space 30S extending between the barrier layer 22 and the curved corner 30A of the metal substrate 300 may be formed by over-etching the metal substrate 300. Next, operations similar to those illustrated in FIGS. 5F-5H may be performed on the structure shown in FIG. 6 to form the package structure 2 illustrated in FIG. 2.

FIG. 6A, FIG. 6B, FIG. 6C, and FIG. 6D illustrate various operations in a method of manufacturing a package structure 3 in accordance with some embodiments of the present disclosure.

Operations illustrated in FIGS. 5A-5C are performed to form the structure shown in FIG. 5C. Next, referring to FIG. 6A, in some embodiments, a metal material may be formed over the surface 102 of the dielectric layer 10 and filled in the openings 10a (or the via holes) of the dielectric layer 10' so as to form through vias 70' and 72 passing through the dielectric layer 10'. The metal material over the upper surface of the dielectric layer 10' may be further patterned so as to form the trace layer 20'. In some embodiments, the trace layer 20' is electrically connected to the patterned metal layer 21. In some embodiments, the aforesaid operations may be performed multiple times to form a plurality of trace layers 20' over the patterned metal layer 21 to achieve a multi-layer conductive trace structure including the trace layers 20 and 20'.

In some embodiments, the patterned metal layer 21 is formed by an electroplating process. In some embodiments, the barrier layer 22 is formed by an electroplating process. In some embodiments, the one or more trace layers 20' are formed by one or more electroplating processes. In the cases where trace layers are formed by etching technique, the as-formed trace layers have relatively wide line width/line space (L/S) due to the processing limits of etching processes, and the overall process for forming multiple trace layers by etching is relatively difficult, which is disadvantageous to the formation of a multi-layer conductive trace structure. In contrast, according to some embodiments of the present disclosure, the trace layers 20 and 20' are formed by electroplating, and thus high-density trace layers capable of providing high I/O counts can be formed, which is advantageous to achieve complex trace design and a multi-layer conductive trace structure.

Figure 6A:
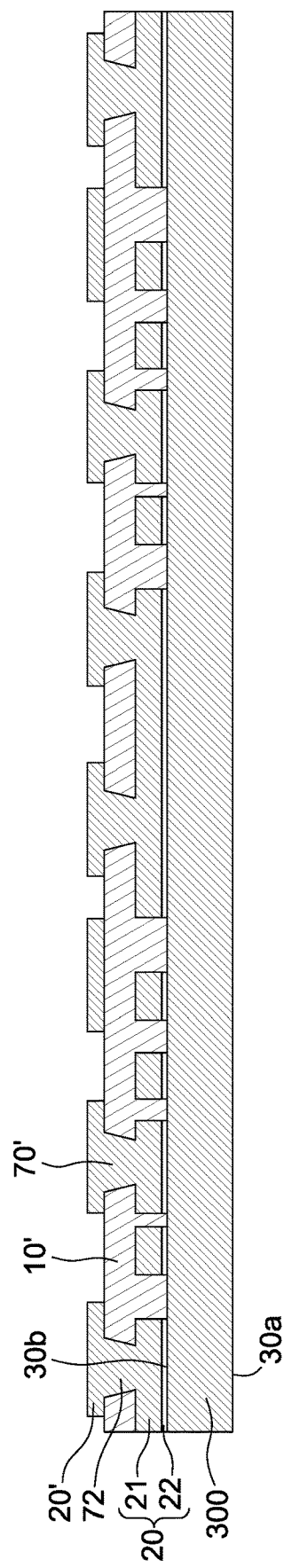
FIG. 6A, FIG. 6B, FIG. 6C, and FIG. 6D illustrate various operations in a method of manufacturing an electronic package structure in accordance with some embodiments of the present disclosure.
Figure 6B:
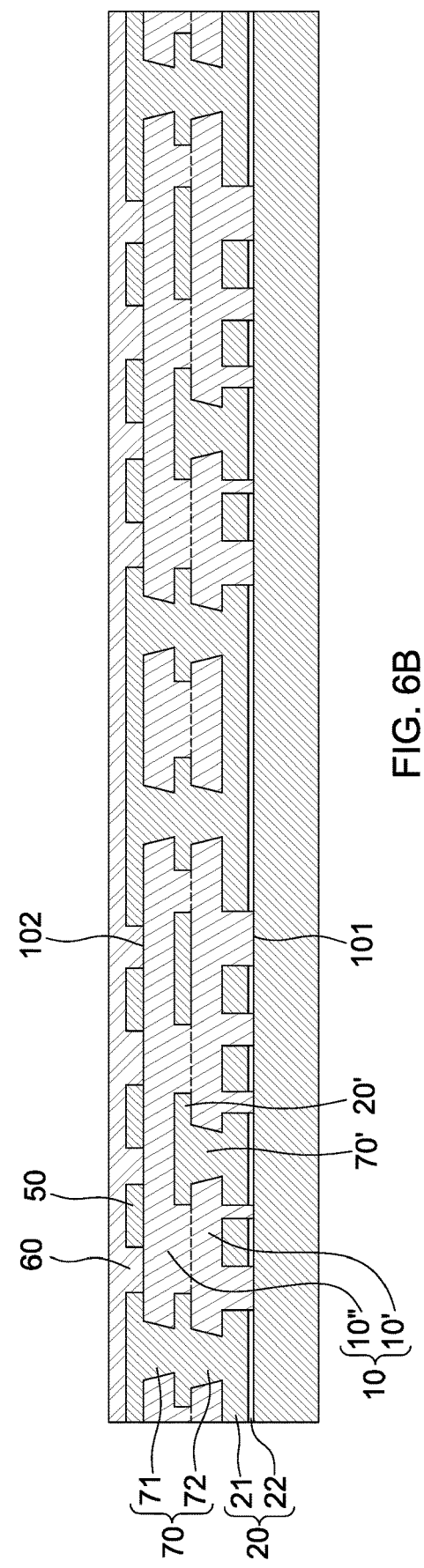

Referring to FIG. 6B, a dielectric layer 10" may be formed over the dielectric layer 10' and the trace layer 20', and then the dielectric layer 10" may be patterned to form openings (also referred to as "via holes") to expose portions of the trace layer 20'. The dielectric layers 10' and 10" form a dielectric layer 10. A metal material may be formed over the surface 102 of the dielectric layer 10 and filled in the openings (or the via holes) of the dielectric layer 10" so as to form through vias 71 passing through the dielectric layer 10". The metal material over the surface 102 of the dielectric layer 10 may be further patterned so as to form the patterned metal layer 50. In some embodiments, the patterned metal layer 50 is electrically connected to the patterned metal layer 21. In some embodiments, an insulating layer 60 is formed on the patterned metal layer 50.

Figure 6C:
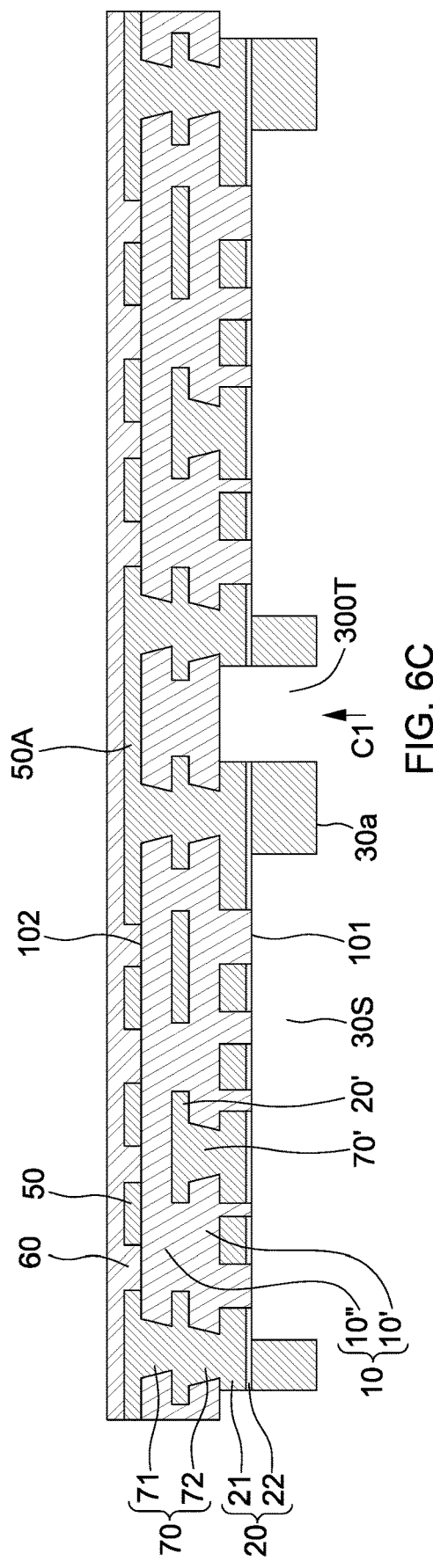

Referring to FIG. 6C, operations similar to those illustrated in FIG. 5E are performed on the structure shown in FIG. 6B to form one or more spaces 30S, a half-cut operation C1 may be performed on the metal substrate 300 from the surface 30a of the metal substrate 300 to define a lateral boundary of a wettable flank 30, and then a protective layer 40 may be formed on the wettable flank 30. A trench 300T defined by the lateral boundaries of at least two adjacent wettable flanks 30 may be formed by the half-cut operation C1. In some embodiments, the trench 300T penetrates not only the metal substrate 300 but also the patterned metal layer 21, and a portion of the dielectric layer 10 is exposed from the trench 300T.

In some embodiments, the protective layers 40 are formed by electroplating. In some embodiments, a portion 50A of the patterned metal layer 50 directly above (or under) the trench 300T connecting the wettable flanks 30 through conductive vias 70 serves as the conductive path for a current to pass through the wettable flanks 30, and thus the plurality of protective layers 40 can be formed in one electroplating operation.

Figure 6D:
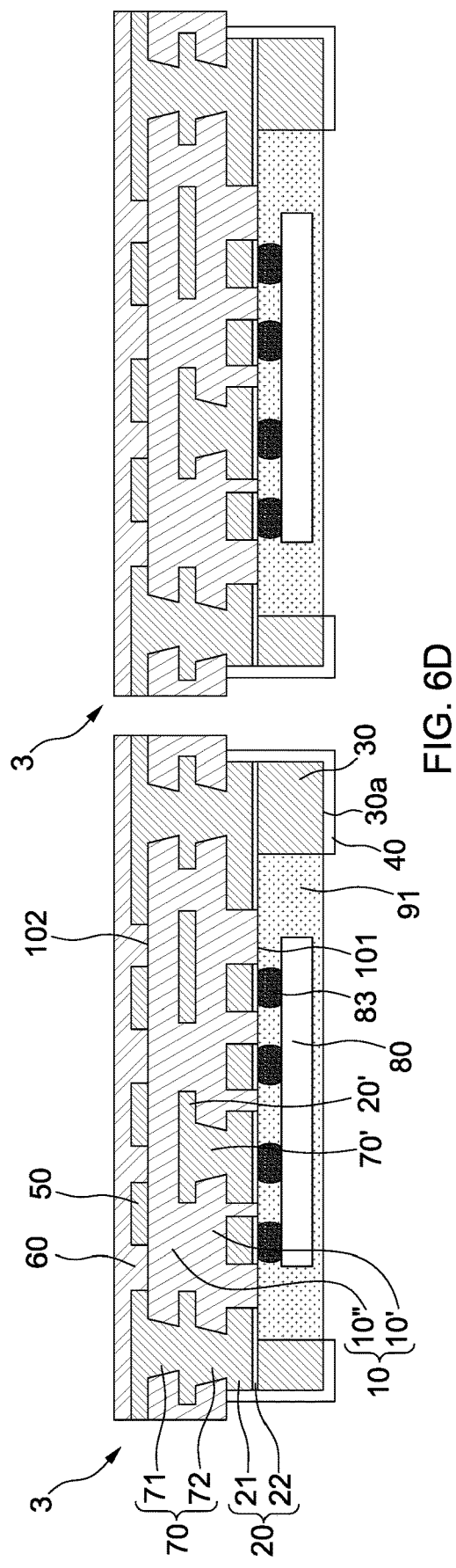

Referring to FIG. 6D, operations similar to those illustrated in FIGS. 5F-5H are performed on the structure shown in FIG. 6C to form singulated package structures 3 illustrated in FIG. 3, and the aforesaid operations are not redundantly described. Different from the embodiments previously described, the protective layer 40 is formed only one the bottom and the side surface of the wettable flank 30 but not on the exposed portion of the dielectric layer 10.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of said numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" or "about" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 μm, no greater than 2 μm, no greater than 1 μm, or no greater than 0.5 μm.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately 104 S/m, such as at least 105 S/m or at least 106 S/m. The electrical conductivity of a material can sometimes vary with temperature. Unless otherwise specified, the electrical conductivity of a material is measured at room temperature.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations do not limit the present disclosure. It can be clearly understood by those skilled in the art that various changes may be made, and equivalent components may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and the like. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. A substrate structure, comprising:
    a dielectric layer having a first surface and a second surface opposite to the first surface;
    a trace layer embedded in the dielectric layer and exposed from the first surface of the dielectric layer;
    at least one wettable flank stacked with a portion of the trace layer embedded in the dielectric layer; and
    a protective layer covering a first surface of the at least one wettable flank.

2. The substrate structure of claim 1, wherein the trace layer has a first surface exposed from the dielectric layer and a second surface opposite to the first surface, and the second surface of the trace layer is covered by the dielectric layer.

3. The substrate structure of claim 1, wherein the at least one wettable flank is in contact with a first surface of the trace layer.

4. A substrate structure, comprising:
    a dielectric layer having a first surface and a second surface opposite to the first surface;
    a trace layer embedded in the dielectric layer and exposed from the first surface of the dielectric layer; and
    at least one wettable flank stacked with a portion of the trace layer embedded in the dielectric layer;
    wherein the at least one wettable flank is in contact with a first surface of the trace layer, and
    wherein the at least one wettable flank has a curved corner proximal to the first surface of the trace layer.

5. The substrate structure of claim 1, wherein the trace layer comprises a patterned metal layer between the at least one wettable flank and the dielectric layer.

6. The substrate structure of claim 1, further comprising a patterned metal layer disposed on the second surface of the dielectric layer.

7. A substrate structure, comprising:
    a dielectric layer having a first surface and a second surface opposite to the first surface;
    a trace layer embedded in the dielectric layer and exposed from the first surface of the dielectric layer;
    at least one wettable flank stacked with a portion of the trace layer embedded in the dielectric layer; and
    a patterned metal layer disposed on the second surface of the dielectric layer,
    wherein the patterned metal layer comprises an antenna structure.

8. The substrate structure of claim 1, further comprising a conductive via passing through the dielectric layer and connected to the trace layer.

9. The substrate structure of claim 8, wherein the conductive via and a portion of the trace layer form a shielding structure.

10. The substrate structure of claim 1, wherein the at least one wettable flank comprises rolled metal grains.

11. A package structure, comprising:
    a dielectric layer having a first surface and a second surface opposite to the first surface;
    a trace layer proximal to the first surface of the dielectric layer;
    at least one wettable flank on a first side of the dielectric layer;
    a die on the first side of the dielectric layer; and
    an antenna structure on the second surface of the dielectric layer.

12. The package structure of claim 11, wherein the trace layer is embedded in the dielectric layer and exposed from the first surface of the dielectric layer.

13. The package structure of claim 11, wherein the at least one wettable flank is disposed on the first surface of the dielectric layer.

14. The package structure of claim 11, wherein the at least one wettable flank comprises at least two wettable flanks, the at least two wettable flanks and the dielectric layer define a space, and the die is disposed in the space.

15. The package structure of claim 11, wherein a thickness of the die is equal to or less than a thickness of the at least one wettable flank.

16. The substrate structure of claim 1, wherein the at least one wettable flank comprises at least two wettable flanks, and the first surfaces of the at least two wettable flanks facing away from the first surface of the dielectric layer are substantially coplanar.

17. A substrate structure, comprising:
    a dielectric layer having a first surface and a second surface opposite to the first surface;
    a trace layer embedded in the dielectric layer and exposed from the first surface of the dielectric layer; and
    at least one wettable flank stacked with a portion of the trace layer embedded in the dielectric layer;
    wherein the at least one wettable flank comprises at least two wettable flanks, and the first surfaces of at least two wettable flanks facing away from the first surface of the dielectric layer are substantially coplanar, and
    wherein the trace layer comprises a barrier layer exposed from the first surface of the dielectric layer.

18. The substrate structure of claim 17, wherein the wettable flank has a curved corner in contact with the barrier layer.

* * * * *